(12) United States Patent
Kriha et al.

(10) Patent No.: US 7,857,997 B2
(45) Date of Patent: Dec. 28, 2010

(54) CONDUCTIVE INK FORMULATIONS

(75) Inventors: James A. Kriha, Neenah, WI (US);
Scott D. Howells, Oshkosh, WI (US)

(73) Assignee: Bemis Company, Inc., Neenah, WI (US)

( * ) Notice: Subject to any disclaimer, the term of this patent is extended or adjusted under 35 U.S.C. 154(b) by 58 days.

(21) Appl. No.: 12/128,145

(22) Filed: May 28, 2008

(65) Prior Publication Data

US 2009/0297803 A1    Dec. 3, 2009

(51) Int. Cl.
*H01B 1/02*      (2006.01)
*B32B 3/00*      (2006.01)
*C23C 28/00*     (2006.01)

(52) U.S. Cl. .............. 252/514; 428/208; 428/209; 428/458; 174/257; 205/183

(58) Field of Classification Search ........... 174/257; 252/514; 428/208, 209, 458
See application file for complete search history.

(56) References Cited

U.S. PATENT DOCUMENTS

| 5,242,511 | A | * | 9/1993 | Yokoyama et al. | ........... 148/430 |
| 5,371,327 | A | * | 12/1994 | Fujinami et al. | ............ 174/257 |
| 5,973,034 | A | * | 10/1999 | Mori et al. | .................. 523/458 |
| 6,156,237 | A | * | 12/2000 | Kubota et al. | ............... 252/512 |
| 6,190,578 | B1 | * | 2/2001 | Yokoyama et al. | .......... 252/512 |
| 6,426,143 | B1 | * | 7/2002 | Voss et al. | .................. 428/378 |

* cited by examiner

*Primary Examiner*—Cathy Lam
(74) *Attorney, Agent, or Firm*—Banner & Witcoff, Ltd.

(57) ABSTRACT

A conductive ink formulation comprising silver, at least one first solvent, and a cross link wherein the cross link agent is present in an amount of about 1.5 wt % to about 6 wt % based on total weight of the formulation. The conductive ink formulation is suitable for printing on polymer film substrates, in particular with a gravure printing method. The polymer film substrates may be then applied to other substrates, for example glass substrates, by any suitable process such as lamination.

16 Claims, 1 Drawing Sheet

CONDUCTIVE INK FORMULATIONS

FIELD

Aspects of the invention relate to conductive ink formulations, in particular conductive ink formulations suitable for electroplating treatment.

BACKGROUND

It is often desired to print conductive inks on polymer film substrates. Such polymer film substrates may then be applied to glass panels, for example. Such glass panels may be used to form solar panels. However, it can be difficult to print conductive inks on film substrates. In particular, the ink often takes a long time to dry or cure which slows down the production process. If the ink is not sufficiently dried, the ink may smear or not properly adhere to the substrate.

The most common methods of printing inks on a substrate are screen printing methods onto glass or integrated circuit boards. Such methods utilize thicker layers of ink and consequently greater amounts of ink. Such screening methods produce good results but at very slow production rates as the required curing times can be 3 to 20 minutes.

A particular type of screen printing is with a rotogravure. This rotogravure screen printing is used to apply conductive ink on thin polymer films for use in thin film solar panels. The expense for this type of printing is very high and processing runs are approximately 50 feet per minute. Moreover, rotogravure screen printing requires two steps, which adds to the overall cost.

There are several problems with screen printing conductive ink on polymer film substrates including printability problems, poor adhesion, and slow drying.

It is very difficult to obtain desired printing results using engraved cells on the rotogravure. The engraved cells do not lay the ink in a continuous line. Instead, a pattern of disconnected diamond shapes or islands is printed as shown in FIG. 1. Such a disconnected pattern does not provide a continuous electrical circuit. The desired effect of the printing process is a well defined straight printed line to provide good electrical circuit conductivity.

Another problem of prior art conductive inks is poor adhesion to the film substrate. The ink may print well onto the film, but the ink then separates from the film. Slowing down the process to allow greater curing or drying time helps alleviate this problem somewhat, but the process becomes too slow for practical production processes. Furthermore, such inks do not react well to later electroplating processes used when preparing solar panels, for example.

Another problem is that poor ink circulation in the holding tank can cause scumming, where the ink separates easily. Thus the ink needs to be constantly stirred or circulated to keep a homogenous consistency.

It is therefore desired to formulate a conductive ink that will provide a well defined printed line or other desired shape and will bind or adhere to a film substrate such that the conductive ink can tolerate an electroplating process

SUMMARY

An aspect of the present invention is directed to a conductive ink formulation comprising a cross link agent.

Another aspect of the present invention is directed to a polymer film substrate printed with the conductive ink formulation.

A further aspect is directed to a method of applying the conductive ink formulation to a polymer substrate with reduced drying time and higher production speed than conventional processes.

BRIEF DESCRIPTION OF THE DRAWINGS

Illustrative aspects of the invention will be described in detail with reference to the following figures in which like elements are labeled with like numbers and in which.

DETAILED DESCRIPTION

An illustrative aspect of the invention will be described in detail. It will be appreciated that aspects of the invention apply as well.

The conductive ink formulation in accordance with an aspect of the invention is suitable for printing on polymer film substrates. The polymer film substrates may be then applied to other substrates, for example glass substrates, by any suitable process such as lamination.

Figure 1:
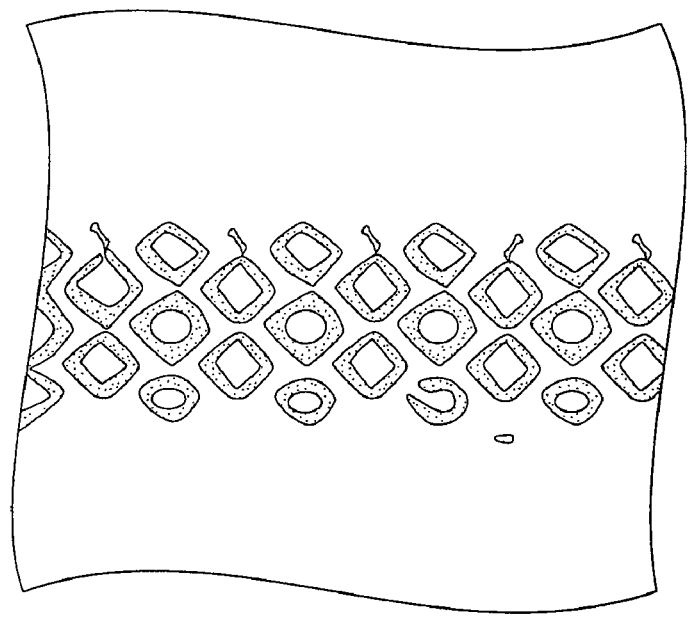
FIG. 1 shows an undesired island effect achieved by prior art inks.
Figure 2:
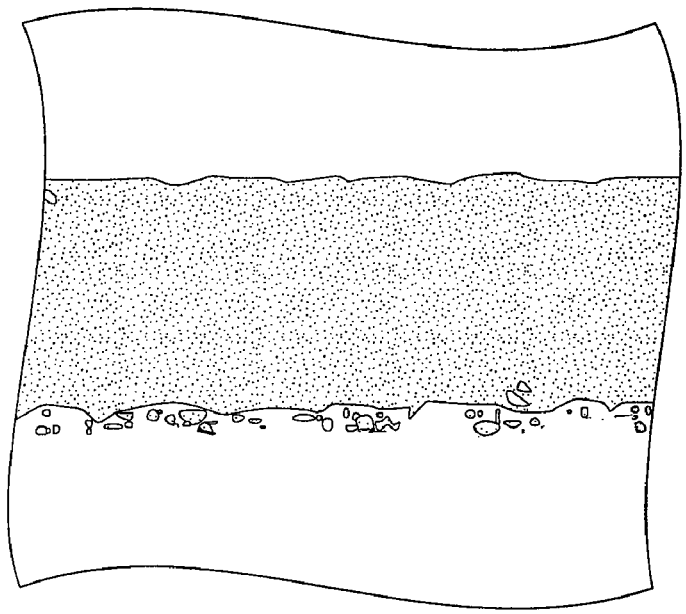
FIG. 2 shows a desired well defined straight printed line achievable with a conductive ink in accordance with an aspect of the invention.

During the printing process, the conductive ink formulation can form a well defined straight printed line to provide good electrical circuit conductivity as shown in FIG. 2. In addition to lines, other well-defined shapes and patterns may be formed with the conductive ink formulations.

The conductive ink formulation has a much quicker drying time and better adhesion to polymer film substrates than prior art conductive inks. Accordingly, the printing process may use a rotogravure cylinder to provide quicker production runs than prior art conductive inks. This allows significantly increased production rates. Moreover, the conductive ink formulation provides the desired adhesion to the polymer film substrate when the polymer film substrate is subjected to an electroplating process.

The conductive ink formulation comprises silver, a solvent mixture, and a cross link agent.

The silver is present in amounts suitable to form the desired conductive ink. Typically the amount may be about 50 wt % to about 75 wt % based on total weight of the conductive ink formulation. In particular, the amount of silver may be 65 wt % to about 75 wt % or 68 wt % to about 70 wt % based on total weight of the conductive ink formulation Generally, it is intended that the dried conductive ink provides a resistance of less than 150 milliohms/square when measured with an ohmmeter. More desirably, the dried conductive ink provides less than 100 milliohms/square of resistance.

The solvent mixture may comprise methyl propyl ketone, n-propyl acetate, n-butyl acetate, isobutyl acetate, and mixtures thereof. For example, suitable mixtures may be n-propyl acetete and n-butyl acetate or n-propyl acetate and methyl propyl ketone. The amount of solvent may vary depending on operating conditions, but is generally between about 25 wt % and about 35 wt % based on total weight of the conductive ink formulation, typically between about 28 at % and about 30 wt % based on total weight of the conductive ink formulation.

The solvent may be any suitable combination of solvents. Suitable combinations include about 5 to about 25% methyl propyl ketone and about 5 and about 25% n-propyl acetate or about 8 to about 15% and methyl propyl ketone and about 15 to about 22% n-propyl acetate.

The cross link agent may be any suitable isocyanate cross link agent in a solvent such as 45 wt % 1,3,5-tris(6-isocyanatohexyl) biuret in 55% ethyl acetate. Any suitable isocyanate to solvent ratio may be used, for example 40-50% isocyanate to 50 to 60% solvent. The amount of cross link agent is about 1.5 wt % to about 6 wt % based on total weight of the conductive ink formulation. In particular, the cross link agent is present in an amount from about 2% to about 4% and more particularly, about 2% to about 3.5%, based on total weight of the conductive ink formulation.

The conductive ink formulation may be prepared by modifying a commercial conductive ink with the cross link agent. Typically, the commercial ink may contain about 70% silver and 30% solvent. In this case, the final conductive ink formulation is formed with 1.5 wt % to about 6 wt % cross link agent and 94 wt % to about 98.5 wt % commercial formulation, particularly about 2% to about 3.5% cross link agent and 96.5 wt % to about 98 wt % commercial formulation.

The conductive ink formulation is applied to a polymer film substrate with a rotogravure printing method. The conductive ink formulation releases easily from the cells of the rotogravure cells.

The conductive ink is then dried. One or any number of driers may be used as is within the skill of the art.

The production speed varies based on drying and print conditions and speed depends on the type and capability of the equipment being used. For example, an NTC press generally provides speeds from 55 to 225 fpm, typically 125 fpm. Other presses can operate at much higher speeds.

The conductive ink formulation may be printed onto the polymer film substrate in any desired line or pattern such as a grid of geometric figures such as squares or rectangles.

The polymer film substrate may be formed from any suitable polymer as is within the skill of the art such as, but not limited to, polyester, nylon, paper, and surlyn. A typical polymer film may be a laminate of two polymers such as polyester-adhesive-surlyn. The conductive ink formulation may be printed on either side of the polymer film.

The polymer film may then be applied to another substrate surface such as glass panels. The glass panels may be electroplated. It is appreciated that the conductive ink formulations applied to the polymer film can withstand electroplating without losing adhesion to the polymer film. Electroplating may be any suitable electroplating process using various combinations of metals.

Example 1

Several conductive ink formulations were prepared using different amounts of cross link agent. The cross link agent was a combination of 45 wt % 1,3,5-Tris(6-isocyanatohexyl) biuret and 55 wt % ethyl acetate.

| Amount of Cross Link Agent | Adhesion Performance | Print Performance |
| --- | --- | --- |
| 1% | Failed | Excellent |
| 1.5% | Occasional issues | Excellent |
| 2-3.5% | Excellent | Excellent |
| 4-6% | Excellent | Fair |
| 6.5-9% | excellent | Very Poor |
| 9.5% | n/a | Unprintable |

Example 2

A formulation was prepared containing 3% 1,3,5-Tris(6-isocyanatohexyl) biuret cross link agent as above and 97% conductive ink. The viscosity of the formulation was determined as follows:

Thin to 17 seconds on #3 Shell cup (20 Centipoise) for optimum conductive and print properties. Can vary +/−2 seconds under "normal" conditions. 13 seconds on a #3 Shell Cup (10 Centipoise) did not meet conductivity requirements. 14 second barely met requirements. 24 seconds on a #3 Shell Cup (35 Centipoise) is barely printable. Conductivity is good, but print quality becomes poor 25 seconds is nearly impossible to print.

The thinning solvent depends on press room conditions of the day, cylinder condition, substrate condition, operator settings, press equipment condition (bearings. run-out, etc.).

The material was webbed through 3 dryers under the following conditions:

Dryer 1 @225 F (Don't want to skin over the ink) Chill Roll On

Dryer 2 @250-275 F (Increase heat to drive off solvent) Chill Roll On

Dryer 3 @300-325 F (Final Dry & Set) Chill Roll On.

While the features herein have been described in connection with various example compositions, structures, and illustrative aspects, it will be understood by those skilled in the art that other variations and modifications of the structures and aspects described above may be made without departing from the scope of the invention. Other aspects will be apparent to those skilled in the art from a consideration of the specification or practice of the features disclosed herein. It is intended that the specification and the described examples only are illustrative with the true scope of the inventions being defined by the following claims.

What is claimed is:

1. A conductive ink formulation comprising silver, a solvent mixture, and a cross link agent, wherein the silver is present in an amount of about 50 wt % to about 75 wt % based on total weight of the conductive ink formulation, the solvent mixture is present in an amount of about 25 wt % to 35 wt %, and the cross link agent is present in an amount of about 1.5 wt % to about 6 wt % based on total weight of the formulation.

2. The conductive ink formulation of claim 1 wherein the cross link agent is present in an amount of about 2 wt % to about 4 wt % based on total weight of the formulation.

3. The conductive ink formulation of claim 1 wherein the cross link agent is present in an amount of about 2 wt % to about 3.5 wt % based on total weight of the formulation.

4. The conductive ink formulation of claim 1 wherein the cross link agent comprises an isocyanate and a second solvent.

5. The conductive ink formulation of claim 4 wherein the cross link agent comprises about 45 wt % isocyanate and about 55 wt % solvent.

6. The conductive ink formulation of claim 4 wherein the isocyanate is 1,3,5-Tris(6-isocyanatohexyl) biuret.

7. The conductive ink formulation of claim 4 wherein the solvent is ethyl acetate.

8. The conductive ink formulation of claim 1 wherein the solvent mixture is selected from the group consisting of a mixture of n-propyl acetate and n-butyl acetate, and a mixture of n-propyl acetate and methyl propyl ketone.

9. The conductive ink formulation of claim 8 wherein the solvent mixture is a combination of n-propyl acetate and methyl propyl ketone.

10. A polymer film substrate printed with a conductive ink formulation comprising silver, a solvent mixture, and a cross link agent, wherein the silver is present in an amount of about 50 wt % to about 75 wt % based on total weight of the conductive ink formulation, the solvent mixture is present in an amount of about 25 wt % to 35 wt %, and the cross link agent is present in an amount of about 1.5 wt % to about 6 wt % based on total weight of the formulation.

11. The polymer film substrate of claim 10 wherein the substrate is printed with the conductive ink formulation in a pattern.

12. A glass panel comprising a polymer film substrate thereon wherein the polymer film substrate is printed with a conductive ink formulation comprising silver, a solvent mixture, and a cross link agent, wherein the silver is present in an amount of about 50 wt % to about 75 wt % based on total weight of the conductive ink formulation the solvent mixture is present in an amount of about 25 wt % to 35 wt %, and the cross link agent is present in an amount of about 1.5 wt % to about 6 wt % based on total weight of the formulation.

13. A method of printing comprising printing a conductive ink formulation onto to a polymer film substrate wherein the conductive film formulation comprises silver, a solvent mixture, and a cross link, wherein the silver is present in an amount of about 50 wt % to about 75 wt % based on total weight of the conductive ink formulation, the solvent mixture is present in an amount of about 25 wt % to 35 wt %, and the cross link agent is present in an amount of about 1.5 wt % to about 6 wt % based on total weight of the formulation.

14. The method of claim 13 wherein the printing method is a gravure printing method.

15. A method of forming a glass panel comprising
   i. printing a conductive ink formulation onto to a polymer film substrate to form a conductive ink pattern, wherein the conductive film formulation comprises silver, a solvent mixture, and a cross link agent, wherein the silver is present in an amount of about 50 wt % to about 75 wt % based on total weight of the conductive ink formulation, the solvent mixture is present in an amount of about 25 wt % to 35 wt %. and the cross link agent is present in an amount of about 1.5 wt % to about 6 wt % based on total weight of the formulation, and
   ii. applying the polymer film substrate to a glass substrate to form the panel.

16. The method of forming a glass panel of claim 15 further comprising electroplating the glass panel over the conductive ink pattern.

\* \* \* \* \*